United States Patent [19]

Scifres et al.

[11] 3,954,534
[45] May 4, 1976

[54] METHOD OF FORMING LIGHT EMITTING DIODE ARRAY WITH DOME GEOMETRY

[75] Inventors: Donald R. Scifres, Los Altos; Robert D. Burnham, Los Altos Hills, both of Calif.

[73] Assignee: Xerox Corporation, Stamford, Conn.

[22] Filed: Oct. 29, 1974

[21] Appl. No.: 518,335

[52] U.S. Cl. ................................ 156/7; 148/187; 156/17; 357/17; 427/85
[51] Int. Cl.² ........................................ H01L 7/50
[58] Field of Search .......................... 357/16–19; 156/7, 8, 13, 17; 427/85, 86; 148/187

[56] References Cited
UNITED STATES PATENTS

| | | | |
|---|---|---|---|
| 3,649,889 | 3/1972 | Hart | 148/187 X |
| 3,675,026 | 7/1972 | Woodall | 357/16 X |
| 3,780,358 | 12/1973 | Thompson | 357/17 X |
| 3,801,391 | 4/1974 | Dyment et al. | 156/17 X |

OTHER PUBLICATIONS

*IBM Technical Disclosure Bulletin*, Vol. 15, No. 6, Nov. 1972, *Double Hetero-Junction GaAs Injection Laser* by Dumke et al., p. 1998.

Primary Examiner—William A. Powell
Attorney, Agent, or Firm—John E. Beck; Terry J. Anderson; Leonard Zalman

[57] ABSTRACT

A structure for providing arrays or individual hemispherical diodes and methods of producing the diodes. When the diode array is to be part of a configuration utilizing a substrate, the substrate is selected to have radiation transparency, a lower refractive index, and lattice constant and lattice structure similar to that of a crystal layer grown in hemispheres formed in the substrate. When the diode array is to be removed from the substrate, a material that can be preferentially etched is grown between the hemispheres formed in the substrate and the grown crystal layer that is to have light emitting areas.

5 Claims, 8 Drawing Figures

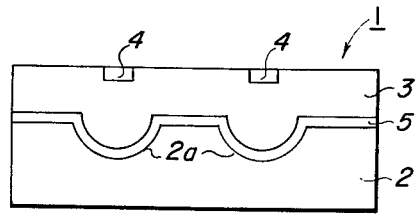
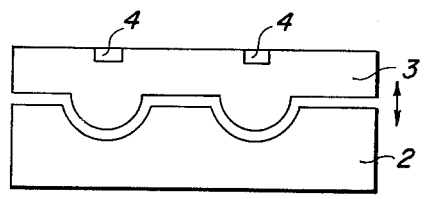
FIG./          FIG./B
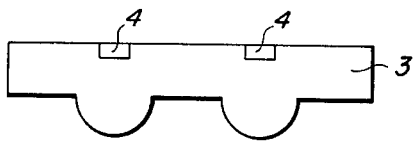
FIG./A
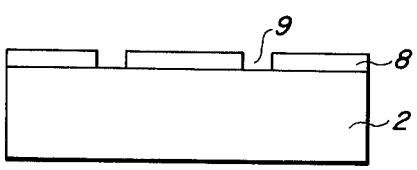
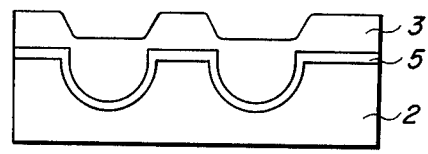
FIG.2A          FIG.2C
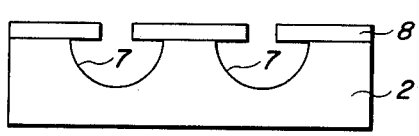
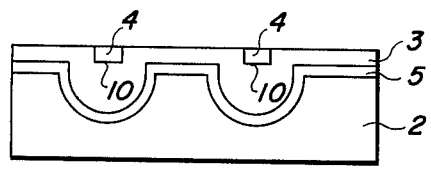
FIG.2B          FIG.2D
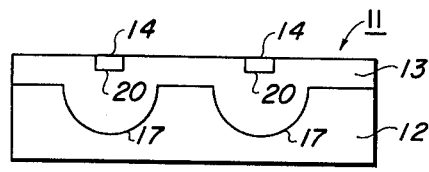
FIG.3

METHOD OF FORMING LIGHT EMITTING DIODE ARRAY WITH DOME GEOMETRY

BACKGROUND OF THE INVENTION

It is well known that electroluminescence is exhibited in the vicinity of a PN junction which is biased so as to inject charge carriers of one type into a region where the predominant charge carriers are of opposite type. Light is emitted in conjunction with the re-combination of pairs of oppositely charged carriers.

Electroluminescent diodes are generally formed of single crystal wafers of group III-V materials, such as gallium arsenide and gallium phosphide, having a PN junction therein. The electroluminescent light that is generated by the recombination of pairs of oppositely charged carriers in the single crystal wafers has great difficulty escaping the crystal. Since the crystals have high indices of refraction, generally about 3.5, and are usually in the shape of rectangular parallelepipeds internal total reflection permits only light photons emitted within a small angle to be transmitted through the surface. This is only a few percent of the total emitted light. The rest of the light is totally reflected from surface to surface until it is finally absorbed inside the crystal or until it escapes via an irregularity in the surface of the crystal.

Attempts have been made to overcome the loss mechanism. One method used has been to shape the crystal in the form of a hemisphere with the light-emitting junction located at the flat bottom surface of the hemisphere. Although this construction has achieved a substantial increase in the amount of emitted light, its fabrication has a number of disadvantages. In one fabrication method two diode cubes of material from the group III-V materials are placed back to back and are tumbled in an abrasive material until the desired hemispherical shape is achieved at which time the spheres are separated. In another method a glass dome is formed over an electroluminescent diode. The glass dome may be formed by placing a preformed glass bead on a heated diode and support subassembly, or by melting a glass in a mold cavity and placing the diode and support subassembly onto the soft glass while in the mold as described in U.S. Pat. No. 3,596,136. The latter method does not overcome the problem of total internal reflection since the diode still has the form of a parallelpiped. However, the angle of escape is somewhat increased. Both of the methods described are costly and time consuming and therefore not suited to large scale production. Also, the described methods cannot produce an entire array of light emitting diodes supported on a common substrate.

OBJECTS OF THE INVENTION

An object of the invention is to provide an improved method of making hemispherical light emitting diodes.

Another object of the invention is to provide an improved method of making an array of hemispherical light emitting diodes.

A further object of the invention is to provide an improved array of hemispherical light emitting diodes.

A still further object of the invention is to provide an improved hemispherical light emitting diode.

SUMMARY OF THE INVENTION

The foregoing objects are achieved in accordance with the invention by forming dome shaped light emitting diodes in an array pattern during crystal growth. In accordance with the invention hemispherical depressions are created on the top surface of a suitable substrate. Such depressions are formed by either a focused laser beam, chemical etching, or by mechanical drilling followed by chemical polishing.

If it is desirable to separate the hemispherical diodes to be formed from the support substrate, a thin, intermediate layer of material that can be preferentially etched away from the substrate and the hemispherical diodes is grown initially in the depressions. The electroluminescent diodes are then formed on the thin layer by growth of semiconductor material of one conductivity type followed by diffusion through holes in nitride or oxide mask of a dopent of the opposite conductivity type to form a PN junction or an array of PN junctions. The area of the junction or junctions is sufficiently small so that the light emitting regions thereof approximate a point source in the hemisphere. Specifically, the thin intermediate layer would contain aluminum which is preferentially etched by hydrochloric and hydrofluoric acids.

If it is desirable to utilize the diode array with the substrate, the intermediate layer is omitted and the substrate is selected to be light transmissive and to have a refractive index lower than that of the layer grown thereon. Since all photons emitted from a point source at the center of the hemisphere will strike the surface at normal incidence there is no angle at which total internal reflection occurs. Thus all the photons escape into the transparent substrate. If the refractive index of the substrate is intermediate between the light emitting material and air there is less reflectance of light photons that strike the hemisphere at a normal or substantially normal angle.

BRIEF DESCRIPTION OF THE DRAWINGS

FIG. 1 is a side view of a device at one step in the production of an array of hemispherical light emitting diodes.

FIG. 1a shows a hemispherical light emitting diode array in accordance with the invention.

FIG. 1b shows the final step in the production of the array of FIG. 1a.

FIGS. 2a through 2d show various steps in the formation of the device of FIG. 1.

FIG. 3 shows another form of an array of hemispherical light emitting diodes in accordance with the invention.

DETAILED DESCRIPTION OF THE INVENTION

Referring now to FIG. 1, there is shown an array 1 of light emitting diodes prior to separation of the array from a support substrate 2. The diodes are comprised of a continuous layer 3 of a group III–V material of one conductivity type that fills hemispherical depressions in substrate 2 and small localized, areas 4 of the opposite conductivity type. Specifically, layer 3 can be n-type and areas 4 can be p-type and substrate 2 can be a group III-V material. Intermediate between the diode array 1 and the substrate 2 is a thin layer 5 of an aluminum-containing material which can be preferentially etched away when the device of FIG. 1 is immersed in an acid bath so as to separate the diode array 1 from the substrate 2 to thereby provide an array of hemispherical light emitting diodes.

Regarding layer 5, if the substrate 2 is GaAs, and the layer 3 is GaAs, the layer 5 can be $Ga_{1-x}Al_xAs$. If the substrate 2 is GaP and the layer 3 is GaP, the layer 5 can be $Ga_{1-x}Al_xP$. Both GaAlAs and GaAlP are preferentially etched in relation to GaAs and GaP by acids such as hydrochloric and hydrofloric, with the aluminum reacting with the acid. The acid is chosen so that it reacts with the aluminum in layer 5 but not with either the group III material of layer 3 or the group III material of substrate 2. If layer 3 is GaAs, substrate 2 is GaAs and layer 5 is GaAlAs, the acid (which in this case can be HCl or HF) is chosen to react with the aluminum in layer 5 but not with the gallium in layer 3 or the gallium in substrate 2.

Although the concentration ($x$) of aluminum in layer 5 is not critical, there must be a substantial amount of aluminum so that the chemical etching reaction can proceed satisfactorily. For etching away layer 5 of the device of FIG. 1 so as to separate layer 3 from the substrate 2, the concentration ($x$) of aluminum should probably be at least about 0.05 which amounts to 2.5 atomic percent of aluminum. However, the greater the concentration of the aluminum, the faster the rate of the chemical reaction. Accordingly, the concentration of aluminum may range from about 0.05 to about 1.0. Also, if layer 5 contains a large amount of Al, layer 3 can contain a smaller amount of Al and still be left intact since the etch rate depends on Al concentration. As noted, the acid in the bath can be hydrochloric or hydrofloric, although any acid that reacts preferentially with the intermediate layer 5 and not the other layers can be used.

The speed of the chemical etching reaction depends upon the concentration of aluminum in layer 5, as noted, and also upon the thickness of layer 5. Good results have been achieved with layer 5 being about 3 microns thick. Decreasing the thickness of layer 5 down to as thin as 1 micron will slow the reaction since the smaller separation between substrate 2 and layer 3 will slow the movement or diffusion of the etchant from the perimeter of layer 5 in contact with the acid of the bath. Increasing the thickness of layer 5, for example, up to 10 microns and above, will speed the chemical reaction since the diffusion of the etchant to the acid bath is less impeded. Increasing the speed of the chemical reaction between layer 5 and the acid of the bath can also be achieved by agitating the acid bath or by heating the acid bath which is normally maintained at room temperature.

Although, when substrate 2 is GaAs and layer 3 is GaAs, the acid of the bath is chosen not to react with the GaAs of substrate 2 and layer 3, there will be a very slight chemical reaction at the perimeter of substrate 2 and layer 3. However, the slight etching does not substantially affect the diode array or the separated substrate, although the edges thereof may require smoothing. As a result of the chemical etching of layer 5, the diode array 1 is removed from the substrate 2. Since the diode array is grown upon the hemispherical depressions in substrate 2 (with only removed layer 5 as an intermediary), the hemispherical surfaces of the diode array (shown in FIG. 1a) are smooth and of good contour. In addition, substrate 2 is not destroyed and can be used again to produce further diode arrays.

The method of producing the device of FIG. 1 is described in relation to FIGS. 2a through 2d. Starting with a generally rectangular substrate 2 hemispherical depressions are formed therein. The depressions can be formed by conventional techniques such as a focused laser beam, by chemical etching, or by mechanical drilling followed by chemical etching. In the conventional chemical etching process, a positive photoresist material is laid down on the top surface of the substrate, preferably having a (111) or (100) crystal orientation, and the photoresist material is exposed in areas where it is desired to form a hemispherical diode. A developer is then used to remove the exposed areas of the resist and to provide a resist mask 8 having circular holes 9, as shown in FIG. 2a. Next, the masked-surface is treated with an acid which etches away part of the exposed substrate 2. The acid may be a white etch containing sulphuric acid, hydrogen peroxide and water. The circular holes 9 in the mask 8 are made smaller than the hemispheres to be formed in the substrate 2, with the smaller areas allowing for sideways spreading of the acid under the mask 8, with the resultant formation of the hemispherical depressions 7 as shown in FIG. 2b. For example, if the radius of the depressions is to be approximately 50 microns, the radius of the circular holes in the resist should be approximately 10 microns. By varying the hole size and depth of etch various shapes of depressions can be made which essentially form lenses and can shape the emitted radiation pattern.

After removal of mask 8, layers 5 and 3 are then formed successively by the sliding boat method conventionally used in liquid phase epitaxial growth. In the growth furnace, the layer 5 is grown first to a thickness of about 5 microns and then n-type layer 3 is grown to a depth of about 100 microns as shown in FIG. 2c. Both of these growths are in accordance with conventional methods. Since the growth of layer 3 requires filling of the entire hemispherical depressions 7, there is a tendency of the layer 3 to have an irregular upper surface above depression 7, as shown in FIG. 2c. This irregularity is removed by polishing, for example, and then the device is masked, in a manner similar to the etching step, and then placed in a diffusion ampoule to produce, by diffusion of a selected impurity, doped areas 4 and hence PN junctions 10, as shown in FIG. 2d with mask removed. With the hemispheres having a diameter of about 100 microns, the diameter of the PN junctions would be about 25 microns.

After removal of any masking material, the device of FIG. 2d is placed in an acid bath as previously described. The acid preferentially etches layer 5 to separate the diode array 1 from the substrate 2 as shown symbolically in FIG. 1b. The preferential etching step is completely described in copending U.S. Patent application Ser. No. 518,334 filed concurrently and entitled "Single Crystal Thin Wafer Preparation." With the diode array, light can be emitted into free space rather than having to first travel through a support substrate with the attendant advantages in operation and external quantum efficiency. Although the invention has been described in relation to production of a diode array, the invention can be used to make individual light emitting hemispherical diodes.

In some cases, it may be desirable to have the diode array supported by, or formed as a part of, a support substrate such as the array 11 shown in FIG. 3. In that array, the preferential etching layer is not present and the diode array 11 is supported directly by substrate 12. The hemispherical depressions 17 in substrate 12 are formed in the same manner as those described in relation to FIG. 1, as are the layer 13 and the areas 14, and the PN junctions 20. The substrate 12 is transparent to radiation produced at the junctions 20 and has an index of refraction less than that of the grown layer 13. Preferably, substrate 12 has a lattice constant and lattice structure similar to that of grown layer 13. These criteria are met by having the substrate 12 of n̄-type gallium aluminum arsenide and the layer 13 of n-type gallium arsenide; areas 14 would then be p-type gallium arsenide. In this example, neither substrate 12 nor grown layer 13 is highly absorptive of the light created at the PN junctions 20. In fact, the n̄-type gallium aluminum arsenide substrate 12 is quite transparent to this radiation so that once the radiation is in the substrate it can be scattered several times until it escapes into free space. In addition, the substrate 12 has a lower refractive index than that of grown layer 13 which increases the transmission of light into adjacent low refractive index mediums such as air.

Other combinations of substrate materials and grown layers are also satisfactory for the device of FIG. 3. For example, the device is quite applicable to growth of hemispheres on certain II–VI substrates such as $ZnS_xSe_{1-x}$, Spinel, and sapphire when layer 13 is a group III–V material such as GaAs. These crystals are transparent to visible and near IR radiation, have refractive indices that are approximately half that of commercial light emitting diode materials, such as group III–V materials, and have lattice constant and structures which are quite similar to GaAs, GaP, GaAsP, and GaAlP (the common light emitting diode crystals) which could be used as the grown layer 13.

What is claimed is:

1. A method of making a light emitting diode having one region with a curved surface comprising the steps of:
    forming a curved depression in a support substrate,
    forming on said curved depression a first crystal layer of semiconductor material containing a substantial amount of aluminum,
    forming on said first layer a second crystal layer of a material containing substantially no aluminum,
    forming a rectifying junction in said second layer and centered over said depression, and
    immersing said layered structure in a bath of an acid which reacts rapidly with said aluminum-containing material but does not react substantially with said material which contains substantially no aluminum thereby to dissolve said first layer to separate said substrate from said second layer such that a light emitting diode having a curved surface is formed.

2. A method of making a light emitting diode having a hemispherical surface comprising the steps of:
    forming a substantially hemispherical-shaped depression in a support substrate,
    forming on the surface of said hemispherical depression a first crystal layer of a semiconductor material containing a substantial amount of aluminum,
    forming on said first layer a second crystal layer of a material containing substantially no aluminum,
    forming a rectifying junction in said second layer and centered over said depression, and
    immersing said layered structure in a bath of an acid which reacts rapidly with said aluminum-containing material but does not react substantially with said material which contains substantially no aluminum thereby to dissolve said first layer to separate said substrate from said second layer such that a light emitting diode having a substantially hemispherical surface is formed.

3. The method of claim 2 wherein said substrate and said second layer are selected from the group consisting of GaAs and GaP, and said first layer is selected from the group consisting of GaAlAs and GaAlP.

4. A method of making an array of substantially hemispherical light emitting diodes comprising the steps of:
    forming in a support substrate an array of substantially hemispherical-shaped depressions,
    forming on the surfaces of said depressions a first crystal layer of a semiconductor material containing a substantial amount of aluminum,
    forming on said first layer a second crystal layer of a material containing substantially no aluminum,
    forming a plurality of rectifying junctions in said second layer with each junction centered over a different depression of said array of depressions, and
    immersing said layered structure in a bath of an acid which reacts rapidly with said aluminum-containing material but does not react substantially with said material which contains substantially no aluminum thereby to dissolve said first layer to separate said substrate from said second layer such that an array of light emitting diodes having substantially hemispherical surfaces is formed.

5. The method of claim 4 wherein said substrate and said second layer are selected from the group consisting of GaAs and GaP, and said first layer is selected from the group consisting of GaAlAs and GaAlP.

* * * * *